US009236862B2

(12) United States Patent   (10) Patent No.: US 9,236,862 B2
Fix et al.   (45) Date of Patent: Jan. 12, 2016

(54) CAPACITIVE TOUCH PANEL DEVICE

(75) Inventors: Walter Fix, Furth (DE); Andreas Ullmann, Zirndorf (DE); Manfred Walter, Nuremberg (DE)

(73) Assignee: PolyIC GmbH & CO.KG, Furth (DE)

( * ) Notice: Subject to any disclaimer, the term of this patent is extended or adjusted under 35 U.S.C. 154(b) by 34 days.

(21) Appl. No.: 14/233,210

(22) PCT Filed: Jun. 21, 2012

(86) PCT No.: PCT/EP2012/061933
§ 371 (c)(1),
(2), (4) Date: Mar. 3, 2014

(87) PCT Pub. No.: WO2013/013905
PCT Pub. Date: Jan. 31, 2013

(65) Prior Publication Data
US 2014/0166464 A1 Jun. 19, 2014

(30) Foreign Application Priority Data

Jul. 22, 2011 (DE) .......................... 10 2011 108 153
Dec. 9, 2011 (DE) .......................... 10 2011 120 654

(51) Int. Cl.
*G06F 3/044* (2006.01)
*H03K 17/96* (2006.01)

(52) U.S. Cl.
CPC ............ *H03K 17/9622* (2013.01); *G06F 3/044* (2013.01)

(58) Field of Classification Search
CPC ............... G06F 3/044; H03K 17/9622; H03K 17/9602; H03K 17/962; H03K 2217/960775; H03K 2017/9602
See application file for complete search history.

(56) References Cited

U.S. PATENT DOCUMENTS

| 4,304,976 | A | 12/1981 | Gottbreht et al. |
| 4,659,874 | A | 4/1987 | Landmeier |
| 4,879,508 | A | 11/1989 | Andermo |
| 5,034,740 | A | 7/1991 | Acher |
| 6,222,522 | B1 | 4/2001 | Mathews et al. |
| 2006/0097991 | A1 | 5/2006 | Hotelling et al. |
| 2009/0073135 | A1 | 3/2009 | Lin et al. |
| 2009/0273573 | A1* | 11/2009 | Hotelling ...................... 345/173 |
| 2010/0001973 | A1* | 1/2010 | Hotelling et al. ............. 345/174 |
| 2010/0090979 | A1* | 4/2010 | Bae ................................ 345/173 |
| 2010/0149108 | A1* | 6/2010 | Hotelling et al. ............. 345/173 |
| 2011/0022351 | A1 | 1/2011 | Philipp et al. |

(Continued)

FOREIGN PATENT DOCUMENTS

DE   2910451 A1   9/1979
DE   30 04461 A1   8/1981

(Continued)

OTHER PUBLICATIONS

International Search report Dec. 2, 2012.

(Continued)

*Primary Examiner* — Kevin M Nguyen
(74) *Attorney, Agent, or Firm* — William Squire (57) ABSTRACT

A multi-layer body for providing a touch panel functionality has a plurality of areas of surface which have a different size defined by corresponding electrically conductive elements; in particular, larger areas of surface are arranged more in a central area of the entirety of the area of surface and smaller areas of surface are arranged more further toward an edge of the body.

24 Claims, 8 Drawing Sheets

(56) References Cited

U.S. PATENT DOCUMENTS

| | | | |
|---|---|---|---|
| 2011/0279406 A1* | 11/2011 | Kawaguchi et al. | 345/174 |
| 2011/0279409 A1* | 11/2011 | Salaverry et al. | 345/174 |
| 2012/0081331 A1* | 4/2012 | Chae et al. | 345/174 |

FOREIGN PATENT DOCUMENTS

| | | |
|---|---|---|
| DE | 3149722 A1 | 9/1982 |
| DE | G8812393.6 | 12/1988 |
| DE | 102005041114 A1 | 3/2007 |
| DE | 20 2006 018448 | 4/2007 |
| DE | 202007007345 | 12/2007 |
| DE | 20 2009 017952 U1 | 10/2010 |
| EP | 2045698 A2 | 4/2009 |
| EP | 2065794 A1 | 6/2009 |
| GB | 2090979 A | 7/1982 |
| GB | 2439614 B | 12/2008 |

OTHER PUBLICATIONS

Examination report in corresponding German application.

* cited by examiner

CAPACITIVE TOUCH PANEL DEVICE

The invention relates to a multi-layer body for providing a touch panel functionality.

In a touch panel, a total panel area comprises a number of subareas, individual areas of surface, in each of which a measurement device is provided in order to detect a touch or at least an approach by a touch object such as for example a finger. In the present case, this can be in particular a capacitively functioning touch panel device in which the individual touch panels are formed by two interacting areas of surface. The areas of surface are provided for example by electrically conductive tracks or other metal elements. In order that two areas of surface can interact, they must be galvanically separated from each other. The electrically conductive elements of one area of surface have a decoupling action (capacitive or via an electromagnetic field), the electrically conductive elements of the other area of surface have a coupling action, with the result that a coupling can thus take place from one area of surface into the other area of surface. Here, one area of surface preferably acts as a transmission area, i.e. is provided for use as an area that transmits an electromagnetic field, and the other area of surface then preferably acts as a receiving area, thus receives the electromagnetic field.

Each individual area of surface must now be connected electrically to a contact area at the edge of the whole touch panel for an evaluation of the measurement results.

If it is desired to form a particularly large area of surface, then it is not possible simply to multiply the number of areas of surface correspondingly, because then the number of connection tracks to be led outwards would increase, with the result that there would not be sufficient space for the connection tracks at the edge of the whole area. Instead, until now the individual areas of surface have been enlarged in order to have sufficient contacting possibilities at the edge. However, this solution cannot be continued indefinitely because touch panels that are too large impair user comfort and, possibly, do not guarantee a sufficiently good spatial resolution.

EP 2 045 698 A2 describes a touch panel device in which touch panels are provided by indium tin oxide in a single layer ("SITO, single layer Indium Tin Oxide"). First groups of areas of surface are in each case electrically continuous. Second areas of surface are in each case individually connected outwardly to an associated contacting. In order to have space available for the connection lines, here the areas of surface located closer to the edge are smaller than the areas of surface located further from the edge.

U.S. Pat. No. 6,222,522 B1 relates to a position sensor for detecting a point of impact of a baton in order thus to simulate a musical instrument. Here, two pairs of areas of surface which, together, form a touch-sensitive panel are designed in each case in the form of two right-angled isosceles triangles.

US 2006/0097991 A1 discloses a touchscreen which can detect the touch on several touch panels at the same time. In an embodiment, individual areas of surface are in each case rectangular, namely in a two-dimensional arrangement. Several areas of surface of a line are led via connection lines to one and the same contact at the edge of the line. Because the number of connection lines increases towards the edge, the respective areas of surface become ever smaller towards this edge.

US 2011/0022351 A1 discloses a capacitive position sensor with complex shapes for areas of surface, namely in each case for individual lines and for individual columns. In an embodiment, the areas of surface of a column have the same shape, apart from the area of surface at the edge. The area of surface at the edge is in particular smaller than the other areas of surface lying further inside.

DE 20 2007 007 345 U1 discloses a two-dimensional position sensor in which triangular areas of surface are provided, wherein two triangles rotated by 180° relative to each other are arranged running parallel to each other with one side in each case to form touch panels. In an embodiment, a sequence of several such triangular areas of surface in a line and an overall larger number of lines are provided.

EP 2 065 794 A1 discloses a touch sensor for a display screen of an electronic device. Here, individual areas of surface have the shape of an unequal right-angled triangle. Two such triangles rotated by 180° relative to each other form a touch panel.

US 2009/0073135 A1 discloses a capacitive touch sensing device. Here, a line is formed through a central, rhombic-shaped area of surface which is surrounded by four unequal-sided, right-angled triangles.

U.S. Pat. No. 4,659,874 A discloses a position sensor for detecting a two-dimensional position in which each line is a touch panel which is formed, for its part, by two right-angled and unequal-sided triangles rotated by 180° relative to each other.

DE 10 2005 041 114 A1 relates to a capacitive control strip and a household appliance with such a strip. The whole capacitive control strip is formed by two large unequal-sided, right-angled triangles rotated by 180° relative to each other. In another embodiment, a large equal-sided triangle supplements two unequal-sided triangles.

An object of the invention is to provide a multi-layer body which can be used to provide a touch panel device in which user comfort is ensured.

The object is achieved by a multi-layer body in which a number of areas of surface are delimited in their shape and size by respective electrically conductive elements, wherein the areas of surface have two classes, of which the electrically conductive elements of an area of surface of a first class serve for use as decoupling elements and the electrically conductive elements of an area of surface of a second class are galvanically separated from the electrically conductive elements of the first class and serve for use as coupling elements and furthermore are arranged such that each area of surface of the first class supplements at least one area of surface of the second class adjacent to it to form a touch panel. An essential idea is now that at least two areas of surface of the same class have a different size.

In this way, it is made possible to provide more complex patterns which are formed from the individual areas of surface. In particular, such patterns, which make it possible to lead several connection lines from areas of surface lying further towards the middle outwards to contact elements, can thereby be provided at the edge. In particular, smaller areas of surface can be provided more at the edge area of the whole surface of the multi-layer body and larger areas of surface can be provided more in the central or middle area of the multi-layer body. If larger areas of surface area provided more in the middle, fewer connection lines lead outwards, therefore the entirety of the connection lines is smaller towards the outside from the middle of the whole area of surface and uses up less space at the edge.

The multi-layer body according to the invention is in particular designed such that each area of surface of the first class is connected to a first contact area at an edge outside all the areas of surface via an area of connection surface, and equally each area of surface of the second class is connected to a second contact area at an edge outside all the areas of surface via an area of connection surface. The edge to which the areas of connection surface lead for the second class can be the same edge to which the areas of connection surface of the first class also lead; equally this one edge can also lie opposite the other edge, for instance can form one side of a rectangle and the other edge can form the other side, or else it can occupy one corner and the other edge can occupy the other corner.

Furthermore, it is provided that, of groups of areas of surface of different size, the smaller are arranged closer than the larger to an edge at which a contact area is provided. In this arrangement, it is guaranteed that the number of the areas of connection surface is less conditional on areas of surface arranged in the middle or centre in the total area of surface than on those areas of surface that lie further at the edge. As a result fewer areas of connection surface need be passed on areas of surface at the edge than if smaller areas of surface were present in the middle, for instance if all the areas of surface had the same size, which is indeed surmounted by the invention.

It is preferably provided that the electrically conductive elements are all provided in a single layer. The multi-layer body can thereby be produced more easily, and thus more cost-effectively.

The electrically conductive elements can be provided in the form of indium tin oxide ("ITO"). In a preferred embodiment of the invention, however, electrically conductive tracks are provided in each case in a pattern by which the respective area of surface is delimited in its shape and size. If such a pattern is used, it can be ensured in particular by sufficient narrowing of the electrically conductive tracks that they can no longer be resolved with the eye and the area of surface appears substantially transparent.

By combining the two preferred embodiments of the provision of only one layer and the electrically conductive tracks in a pattern, the following is thus obtained:

A multi-layer body which has a layer in which in a number of areas of surface electrically conductive tracks are provided in each case in a pattern by which the respective area of surface is delimited in its shape and size. The areas of surface can be assigned to two classes, of which the electrically conductive tracks of an area of surface of a first class serve for use as decoupling elements, in particular elements that transmit an electromagnetic field, and of which the electrically conductive tracks of an area of surface of a second class are galvanically separated from the electrically conductive tracks of the first classes and serve for use as coupling elements, in particular elements that receive an electromagnetic field from an area of surface of the first class, and are arranged such that at least one area of surface of the first class is supplemented by a respective adjacent area of surface of the second class to form a touch panel. An essential idea is furthermore that at least two areas of surface of the same class have a different size.

Furthermore, as stated above, the areas of connection surface are provided, and preferably provided by electrically conductive tracks in a pattern. Here too, the smaller areas of surface are arranged closer to an edge than the larger areas of surface.

In a preferred embodiment of the multi-layer body, in the case of at least one subgroup of the areas of surface with two areas of surface of different size every two areas of surface of different classes are assigned to each other in order to supplement each other to form a touch panel, and have the same size.

In other words, at least as far as the subgroup is concerned, the touch panel shapes are the same, but have different sizes. Particularly in the case of geometrically simple shapes such as triangles, squares, pentagons with hexagons and octagons, this has the advantage that the touch panels of the subgroup can occupy the area of surface in a geometrically closely packed manner. For the user, it is also particularly intuitive to detect that it is the touch panels that form the individual units and not for instance the individual areas of surface that supplement each other to form a touch panel.

Areas of surface assigned to each other (from the two different classes) here preferably have the same shape. In particular in the case of an inherent symmetry of such a shape, the areas of surface can be allowed for relatively closely packed in the whole area of surface, which is advantageous for operation. The assigned areas of surface can e.g. form an isosceles triangle with a right angle, with the result that they can supplement each other to form a square overall. However, the areas of surface assigned to each other are preferably rectangular, because through such rectangles a simple tessellation of the areas of surface can be allowed for, even if they have different sizes.

Rectangles of different sizes can result from each other here in particular by scaling with a factor of less than 0.5, preferably of between 0.25 and 0.34. In the case of such a scaling, two of the smaller rectangles fit on one side of a larger rectangle, and there is still space for a connection line led outwardly from the larger rectangles. The scale factor can remain the same in the case of rectangles of three and more different sizes, but the factor preferably becomes successively smaller towards the smaller rectangles in order to accommodate the number of connection lines that becomes larger towards the outside. Instead of a scaling, a compression, i.e. a change in length in only one spatial direction, can also be provided.

In another preferred variant of the embodiment with identically shaped touch panels, although areas of surface assigned to each other do not have the same shape, they are geometrically similar, wherein in particular their shapes are mirror-symmetrical to each other. In this way, the shapes can be formed such that they two assigned areas of surface of different classes interlock in order to form the touch panel. This is true in particular when areas of surface assigned to each other are triangular, preferably with a right angle in the triangle shape, in order that the mirror-symmetrical or point-symmetrical triangles supplement each other at least to form a rectangle (e.g. in the case of three different angles in the triangles).

In another embodiment of the invention, an area of surface of the class other than the same class has a third size different from the two sizes of the areas of surface of the same class. In other words, the areas of surface can be brought into a sequence of their sizes, in which the areas of surface of different classes preferably alternate with each other. In this way, complex geometrical arrangements and patterns can be provided in which it is possible to get away from the concept of the touch panel of the same shape.

Here, it can be provided e.g. that at least one area of surface of one class is assigned to more than one area of surface of the other class in order to supplement each other in each case to form a touch panel. To some extent, touch panels that overlap each other are involved in which in each case the at least one area of surface belongs to one class, but in each case another area of surface belongs to the other class.

It can be provided that areas of surface of different size are geometrically similar. As is known, in particular in the case of squares and triangles, the basic shape can be divided into a number of geometrically similar subshapes of the same size.

However, it can also be provided that of two adjacent areas of surface one is square and one is rectangular, wherein in particular the rectangle has the side lengths of the square. Preferably, the larger size of the rectangle here has the side length of a larger square and its smaller size length has the side length of a smaller square which adjoins the corners of the larger square and is assigned to the same class. In the embodiment with areas of surface in three sizes, it can be provided that areas of surface of different size are not geometrically similar.

For example, there can be square areas of surface of different size of one class and L-shaped areas of surface of the other class, with the result that in each case an L-shaped area of surface of the other class can supplement a small square of the first class to form a square which is equivalent to a larger square of the first class; the whole area of surface can then be simply divided into squares, but areas of surface in different sizes can still be provided.

Equally, one class can feature areas of surface of different size and/or of different shape, then the areas of surface of the other class can have a sawtooth outline (in particular one complementary to at least one of the shapes), for instance in the manner of a Christmas tree shape or a shape formed from dividing a Christmas tree shape.

In all the named embodiments and possible further embodiments, it can be provided that the electrically conductive tracks are not transparent, but that their width (and in particular also their spacing) is chosen such that the areas of surface are transparent for the human eye. Such a width lies in particular between 1 µm and 40 µm, preferably between 5 µm and 25 µm. The distance between two strip conductors can lie between 10 µm and 5 mm, it preferably lies between 300 µm and 1 mm. If the width of the electrically conductive track is chosen correspondingly, the electrically conductive tracks are not visible for the human eye. The areas of surface can be transparent for the human eye in particular when the eye of the observer is at a distance of more than 30 cm from the area of surface and the width of the conductive tracks and/or the spacing of these tracks is so small that a spatial resolution by the human eye is no longer possible. By transparent can be means in this connection in particular that the transmission for visible light is over 80%, preferably over 90%. However, other degrees of transparency are also possible, as long as the strip conductors cannot be resolved by the human observer. In an operating device with a multi-layer body as touch panel device and a display device to which the multi-layer body is applied, the outlines of the areas of surface, or better yet of the touch panels, can then be indicated to the observer by lines on a representation on the display device, without the touch panels being immediately visible as such. The designer of the operating device is thus not tightly bound to the specifications by the touch panel device, but can much more freely choose an appropriate method for control in the form of an algorithm of a computer program.

Here, the edges with the contact areas can be arranged only on two opposite sides of the entirety of the areas of surface, and only in respect of these edges can the areas of surface of different size be smaller at the edge than the larger. In other words, in this case the order of the areas of surface according to their size is only one-dimensional, there need be no order of this type in the other dimension, or there can be another order.

Alternatively, edges with contact areas completely surround the entirety of the areas of surface, and in all directions (in the plane) the smaller areas of surface are arranged closer to a respective edge than the larger ones, with the result that a two-dimensional arrangement is obtained.

The two named alternatives can be provided depending on the design concepts. The one-dimensional arrangement can be advantageous if for example menu bars, on which operating elements are selected by tapping, are provided at the top and bottom on a screen representation. The two-dimensional arrangement can be advantageous if image symbols are arranged distributed over the screen.

However, common to both embodiments is that larger shapes are represented more in the middle, or centre, on the screen representation, and smaller shapes are represented at the edge. The inventors of the multi-layer body claimed here have recognized that precisely typical operating solutions require a lower resolution in the centre of a display than at the edge. In particular, in the middle of the display an operation can take place by means of gestures which are carried out by more than one finger of an operator (so-called multi-touch capacity), wherein in particular the physiologically predetermined minimum distance between two fingers determines the maximum resolution necessary for detecting a gesture and accordingly the resolution requirements are comparatively small. In contrast, typical operator control actions at the edge usually require in particular only the use of one finger, the position of which should be very accurately detected, which involves the necessity of a high spatial resolution.

In the named embodiment example, preferably at least two areas of surface of the first class and at least two areas of surface of the second class are in each case connected to each other via areas of connection surface which are provided by electrically conductive tracks in a pattern. Particularly small areas of surface can be provided by a suitable electrical circuit, without there being difficulties during their contacting. Thus, in particular the touch panel device can be realized with the touch panels in a single layer, together with the wiring, at least in one area that is preferably transparent for the human eye. Thus, touch panels of high transparency can be manufactured cost-effectively by the special design and structuring of the electrically conductive layer with the electrically conductive tracks.

In a preferred embodiment of the invention, the individual areas of surface occupy a surface area of between 0.25 to 10 $cm^2$, preferably of between 0.64 and 2 $cm^2$. If the areas of surface are divided into areas of surface of two different sizes, the smaller areas of surface can preferably occupy a surface area of between about 0.25 of 5 $cm^2$ and the larger areas of surface occupy a surface area of between 1 and 10 $cm^2$.

If the areas of surface are divided into exactly three groups of different size, the smaller areas of surface can occupy a surface areas of between 0.25 and 5 $cm^2$, the medium-sized areas of surface can occupy a surface area of between 0.5 and 7.5 $cm^2$, and the largest areas of surface can occupy a surface area of between 0.75 and 10 $cm^2$. From the range of from 0.25 to 10 $cm^2$ another four or more sizes can also be assigned. The named surface areas apply independently of the specifically chosen shape for the areas of surface.

The object of providing a multi-layer body by which a touch panel device can be provided in which user comfort is ensured is also achieved in a further aspect, not claimed separately here, by a multi-layer body in which, in a number of areas of surface, electrically conductive elements are provided by which the respective area of surface is delimited in its shape and size, and wherein the areas of surface have two classes, of which the electrically conductive elements of an area of surface of a first class serve for use as decoupling elements, in particular elements that transmit an electromagnetic field, and the electrically conductive elements of a second class are galvanically separated from the areas of surface of the first class and serve for use as coupling elements, in particular elements that receive an electromagnetic field and are arranged such that in each case an area of surface of the first class supplements precisely one area of surface of the second class to form a touch panel, wherein the touch panels are provided in a grid arrangement by which two grid directions are defined, and wherein two mutually supplementing areas of surface of a touch panel are separated from each other by a gap and wherein the gaps run between associated electrically conductive elements such that two adjacent touch panels in the grid arrangement have a larger average grid distance between each other in a first grid direction than in a second grid direction.

In this aspect, a first resolution can thus be achieved in the first grid direction and a second resolution can be achieved in the second grid direction, wherein the first resolution is coarser than the second resolution. The coarser resolution can serve to provide a multi-touch functionality in which an operator taps on different touch panels with two fingers in order to enter a particular command. The average grid distance in the first grid direction then corresponds to a typical distance between two fingers. In contrast, in the direction of the second grid direction it can be provided that the movements take place with the fingers individually. For example, the first grid direction can be the horizontal direction, because a hand stretched out forwards has the fingers next to each other rather than one below another. The second grid direction is then naturally the vertical direction, because for example the gradual scrolling over a scroll bar can be made possible downwards with the aid of one finger.

In the preferred embodiment in this second aspect, each grid distance between two adjacent touch panels is larger in the first grid direction than each grid distance in the second grid direction. This is important in particular when the grid distances differ from touch panel to touch panel; here the resolution in the first grid direction in each case remains coarser than in the second grid direction.

The grid is preferably regular, namely the grid arrangement particularly preferably has touch panels in a rectangular shape which, however, is not that of a square.

In particular, such a rectangular shape can be formed particularly simply by the electrically conductive elements being designed in the shape of right-angled, but unequal-sided triangles. The gap between the two electrically conductive elements which supplement each other to form the touch panel in then rectilinear.

However, in this further aspect the invention is not limited to the provision of rectilinear gaps.

The object of providing a multi-layer body by which a touch panel device can be provided in which user comfort is ensured is also achieved in a second aspect of the invention by a multi-layer body in which, in a number of areas of surface, in each case electrically conductive elements are provided by which the respective area of surface is delimited in its shape and size, and wherein the areas of surface have two classes, of which the electrically conductive elements of an area of surface of a first class serve for use as decoupling elements, in particular elements that transmit an electromagnetic field, and the electrically conductive elements of an area of surface of a second class are galvanically separated from the elements of the areas of surface of the first class and serve for use as coupling elements, in particular elements that receive an electromagnetic field and are furthermore arranged such that each area of surface of the first class supplements in each case precisely one area of surface of the second class adjacent to it to form a touch panel, wherein the mutually supplementing areas of surface have the same shape, which is different from a rectangle, but the shape of one is rotated by 180° compared with that of the other.

With a suitable choice of the shape such that it matches itself exactly when it is rotated by 180°, the areas of surface can thus be provided particularly compact; the resolution achievable thereby is particularly low compared with the surface area occupied by the touch panel. It is thereby possible to cut down on areas of connection surface, with the result that a particularly large touch panel device can be constructed.

The high resolution is advantageous in particular when it is applicable both line by line and column by column; this means that lines and columns can be assigned to the areas of surface, and in each line and in each column in each case a number of areas of surface of the same class is then provided. In this way, in particular a multi-touch capacity can be produced, i.e. an operator can tap on different touch panels with two fingers simultaneously in order to enter a particular command.

In the multi-layer body according to this second aspect of the invention, it is preferably provided that the areas of surface are triangular, wherein they preferably have a right angle. Two identical right-angled triangles, of which one is rotated by 180° compared with the other (and is thus point-symmetrical), supplement each other perfectly to form a rectangle, with the result that a touch panel is provided as a rectangle; then several touch panels can be arranged ideally in one grid.

In the second aspect of the invention, according to the above-named further aspect, is it preferably provided that two mutually supplementing areas of surface are separated from each other by a gap, and wherein all the touch panels are arranged such that two adjacent touch panels in the grid arrangement of lines and columns have a larger average grid distance between each other in a first grid direction than in a second grid direction.

In one aspect, in particular a touch panel device is used which comprises a multi-layer body according to the second or third aspect of the invention with several areas of surface in lines and columns, wherein the individual points on the touch panel device are chosen freely while adhering to a minimum distance (such as provided naturally for example with fingers as touch bodies by the anatomy of the human hand) from each other.

In another aspect, a touch panel device is used which comprises a multi-layer body according to the first aspect of the invention, in which a distinction is drawn between the edge and a central area of the multi-layer body; here the number of points is then located in a central area, thus precisely not at the edge: In the central area there are fewer touch panels, but a high resolution is not necessary there because commands are entered with a number of fingers at the same time instead of with one finger.

Preferred embodiments of the invention are described in more detail below with reference to the drawings, in which.

Figure 1A:
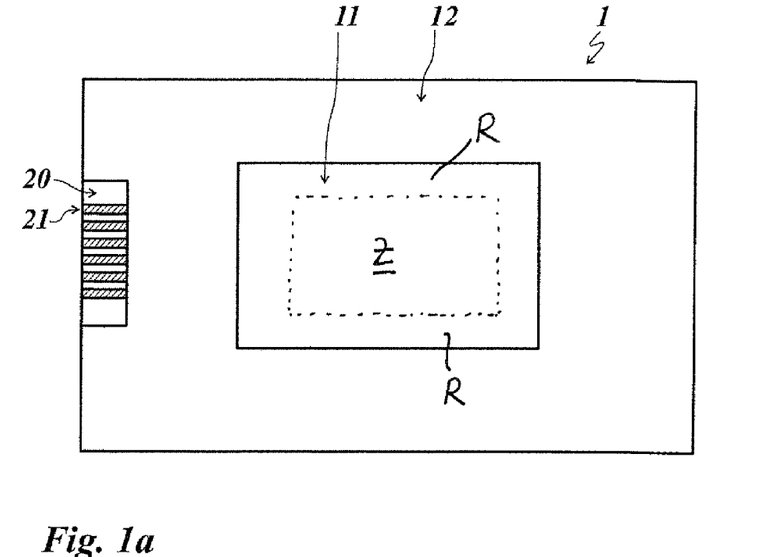
FIG. 1a shows a schematic top view of a multi-layer body.
Figure 1B:
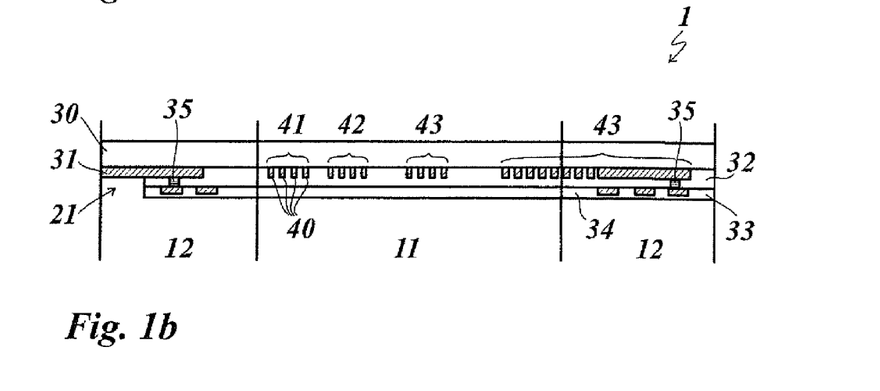
FIG. 1b shows a schematic sectional representation of a multi-layer body.
Figure 2A:
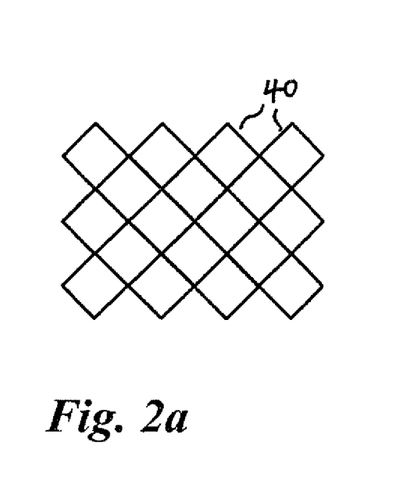
FIG. 2a to FIG. 2d show schematic representations of a section from a pattern of electrically conductive, non-transparent tracks.
Figure 2B:
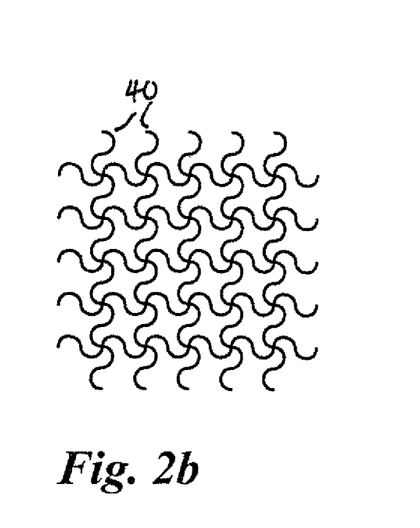
Figure 2C:
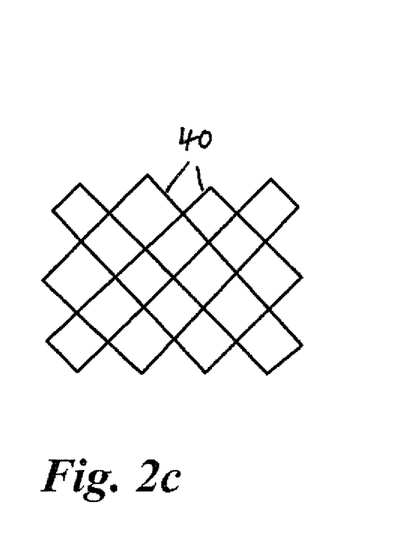
Figure 2D:
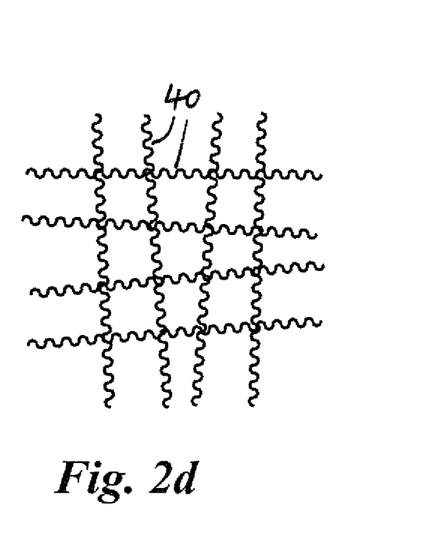

FIG. 1*a* shows a top view and FIG. 1*b* shows a sectional representation of a multi-layer body 1. The multi-layer body 1 has a carrier substrate 30, a first electrically conductive layer 31, a dielectric layer 32, a second electrically conductive layer 33 as well as a dielectric layer 34.

It is also possible that the multi-layer body 1 does not have all of the above-named layers, but only consists of the carrier layer 30 and the first electrically conductive layer 31. It is further possible that the multi-layer body 1, in addition to the layers shown in FIG. 1*b*, comprises still further layers, for example one or more decoration layers or further electrically conductive layers.

The multi-layer body 1 has an area 11 in which the multi-layer body 1 appears transparent for the human observer, and it has an area 12 in which the multi-layer body 1 likewise appears transparent for the human observer, but can also be designed semi-transparent or opaque. Furthermore, the multi-layer body 1 has a contact connector 20 with several contact panels 21, via which an electrical contacting of the multi-layer body is possible. However, it is also possible that the multi-layer body 1 does not have such a contact connector, and that the contacting of the electrically conductive layer or layers of the multi-layer body takes place by means of electrically conductive adhesive joints, bonded joints, soldered or welded joints.

The area 11 can be divided roughly into an edge area R and a central area Z. The central area Z can in turn be divided into further areas in a manner not shown in FIG. 1*a*, e.g. a particularly central area and a middle edge area belonging to the central area, etc. In the present case, it is not a matter of exact division, it is only a matter of drawing a distinction between areas which lie more at the edge R and areas which lie more in the central area Z.

The carrier substrate 30 preferably consists of a flexible plastic film, for example of polyethylene (PE), polypropylene (PP), polyvinyl chloride (PVC), polystyrene (PS), polyester (PE) and/or polycarbonate (PC). The flexible plastic film preferably has layer thicknesses of between 15 µm and 300 µm, preferably of between 23 and 100 µm. The carrier substrate 30 is designed transparent at least in the area 11; but the carrier substrate is preferably designed transparent over the whole surface and thus consists for example of a transparent plastic film.

The first electrically conductive layer 31 preferably consists of a metal, for example copper, aluminum, chromium, silver or gold. This metal layer is preferably applied to the carrier substrate 30 in a layer thickness of between 20 nm and 100 nm and structured. The application can take place by means of vapour deposition, sputter deposition or another application process. The structuring preferably takes place here by means of an etching process (positive etching or negative etching) or by means of a washing process. Equally, a printing process can also be used for the structuring. The application and structuring can also take place in one step, e.g. if an application mask is used.

An adhesion-promoter layer which improves the adhesion of the first electrically conductive layer 31 to the carrier substrate 30 can also be arranged between the carrier substrate 30 and the first electrically conductive layer 31. Such an adhesion-promoter layer is preferably likewise formed from a transparent material.

In the first electrically conductive layer 31, in the first area 11 there are provided a plurality of electrically conductive areas 41 of the first class, a plurality of electrically conductive areas 42 of the second class, and connection areas 43. The electrically conductive areas 41 of the first class and the electrically conductive areas 42 of the second class are galvanically separated from each other, in order that the electrically conductive areas 41 of the first class can serve as transmission areas which transmit an electromagnetic field, and the electrically conductive areas 42 of the second class can serve as receiving areas which receive an electromagnetic field from an area of the first class. The electrically conductive areas 41, 42 and 43 in each case consist of a pattern of electrically conductive, non-transparent tracks 40, the width of which in the first area 11 is chosen such that the electrically conductive areas of the first and second class and the connection areas appear transparent for the human eye. The tracks 40 thus have for example a width of between 1 µm and 40 µm, preferably of between 5 µm and 25 µm. The connection areas 43 in each case connect one or more of the areas 41 of the first class or of the areas 42 of the second class to a contact area arranged outside the area 11. It is also possible and advantageous that the connection areas 43 outside the area 11 are covered over the whole surface with the electrically conductive layer 31, or are covered with a pattern of electrically conductive, non-transparent tracks 40, the width of which is chosen such that the areas 43 in this area 12 do not appear transparent for the human eye. It is hereby possible to increase the conductivity of the areas 43 in the area 12, at the expense of the transparency, which is, however, no longer relevant in this area.

Contact areas can be formed here from the contact panels 21 of the contact connector 20, but it is also possible that a contact area represents an area in which the first electrically conductive layer 31 is contacted, for example over a via, with another electrically conductive layer; the contact area can also be formed from an area of the first electrically conductive layer 31 in which a connection track (appearing opaque for the human observer) of the electrically conductive layer 31 passes into an area 43 (appearing transparent for the human observer) of the first class.

As indicated in FIG. 1*b*, the contact panels 21 of the contact connector 30 are also formed in the first conductive layer 31. However, it is also possible that the contact panels 21 are formed, not in the electrically conductive layer 31, but in another electrically conductive layer, for example in the electrically conductive layer 33. In the area of the contact panels 21, the first electrically conductive layer 31 can here have a larger layer thickness or else be boosted with another or the same electrically conductive layer.

The dielectric layer 32 is then applied to the first electrically conductive layer 31. The dielectric layer 32 is preferably a transparent varnish which is applied to the electrically conductive layer 31 by means of a printing process in a layer thickness of from 1 µm to 40 µm. It is advantageous here if, in the areas in which vias 35 are to be provided later, no material is already applied when the dielectric layer 32 is applied.

Furthermore, the electrically conductive layer 33 is then applied. The second electrically conductive layer 33 is preferably a layer which is applied by means of printing an electrically conductive printing material, for example carbon black or conductive silver. During printing, the recesses provided in the dielectric layer 32 here can simultaneously be filled with the printing material and thus the vias 35 through the electric layer 32 can simultaneously be filled with conductive material. The conductive layer 33 is preferably structured such that, by means of this layer, several of the connection areas 43 of the electrically conductive layer 31 are electrically connected to each other and thus the number of contact panels 21 of the contact connector 20 can be reduced.

In the area 11 next to the electrically conductive layer 31, further electrically conductive layers are preferably no longer provided in the multi-layer body 1.

The electrically conductive tracks 40 in the three types of areas 41, 42, 43 are preferably arranged according to a pattern illustrated in FIGS. 2a to 2d. As shown there, the electrically conductive tracks 40 are here arranged not parallel to each other as far as possible in order to avoid diffraction and moiré effects, and further having a plurality of crossover points in order thus to provide as uniform as possible a surface conductivity in the areas 41, 42 and 43.

The electrically conductive tracks 40 in each case delimit an area of surface, the shape and size of which will be discussed in more detail below. The delimitation takes place in that a respectively outer conductive track 40 is spaced apart from the conductive track 40 of another area of surface by a distance of between 10 μm and 5 mm, preferably of between 150 μm and 500 μm and is preferably galvanically separated from it. The individual areas of surface have a surface area of between 0.25 and 10 cm². The width and spacing of the conductive opaque tracks in the individual areas of surface is chosen such that these areas have an average surface conductivity of between 0.1 ohm (ohm/square) and 10 ohm (ohm/square), preferably between 0.5 ohm (ohm/square) and 2 ohm (ohm/square).

In the present case, the concept is put forward that different areas of surface of the same class have a different size, i.e. occupy a different surface area.

Figure 3:
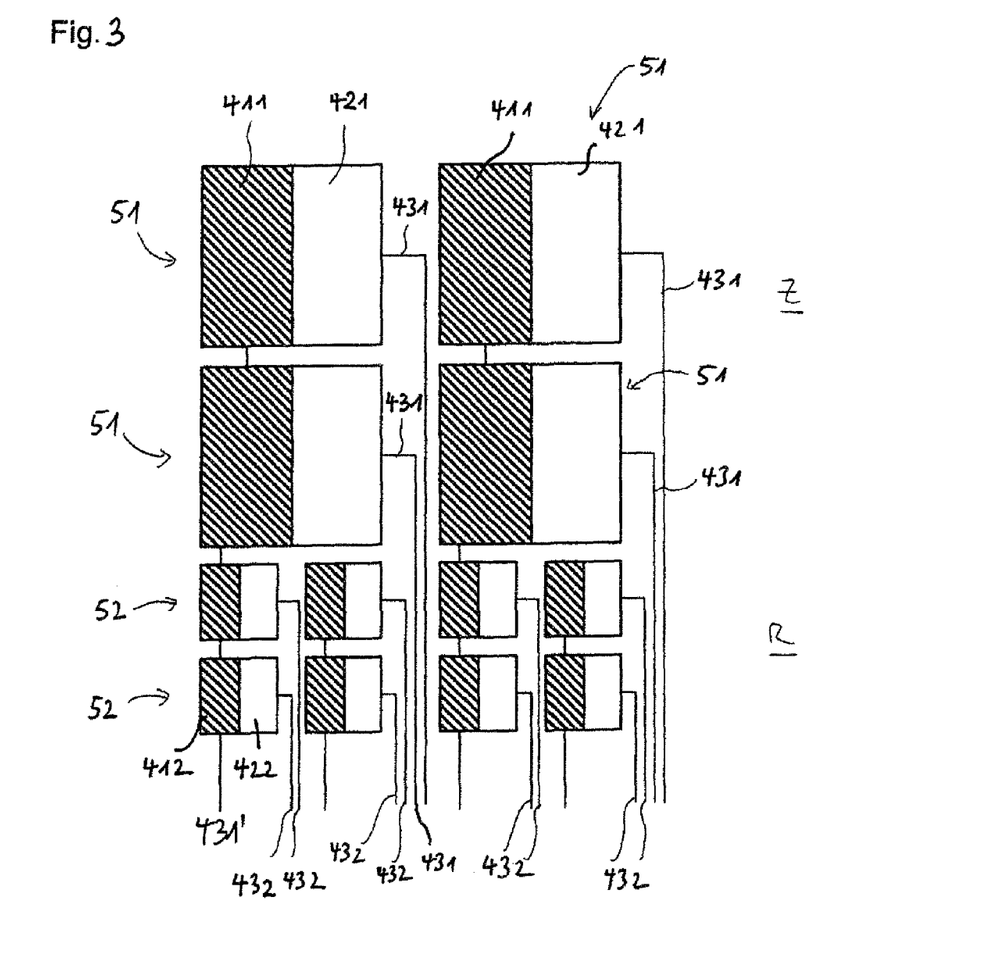
FIG. 3 illustrates a section from a multi-layer body according to the invention according to a first embodiment of the invention in top view.

In an arrangement according to FIG. 3, in each case areas of surface 411 of the first class supplement areas of surface 421 of the second class to form touch panels 51 in the centre Z of the transparent area 11. Further at the edge R of the transparent area 11, much smaller areas of surface 412 of the first class supplement corresponding areas of surface 422 of the second class to form square touch panels 52. A galvanic separation in the form of a gap is located between the areas of surface 411 and 421 or between the areas of surface 412 and 422.

The side length of one of the square touch panels 52 is smaller than half the side length of the square touch panels 51. For example, the square touch panels 51 have a side length of between 0.5 and 3.2 cm and the square touch panels 52 have a side length of between 0.2 and 1.5 cm.

Because the touch panels 52 or the areas of surface 412, 422 forming them are smaller than the corresponding touch panels 51 or the areas of surface 411, 421 forming them, there is space at the edge R for the connection lines 431, which emanate from the areas of surface 421, and 431', which emanate from areas of surface 411, 412 connected together. At the edge R, sufficient space is likewise available to the connection tracks 432 emanating from the touch panels 52. Overall, it is possible to manage with fewer connection tracks 431, 431', 432 than if the size of the individual touch panels were exactly as large in the centre Z as at the edge. In the area of the edge, contact areas not shown in FIG. 3 are formed as described above with regard to FIG. 1.

Figure 4A:
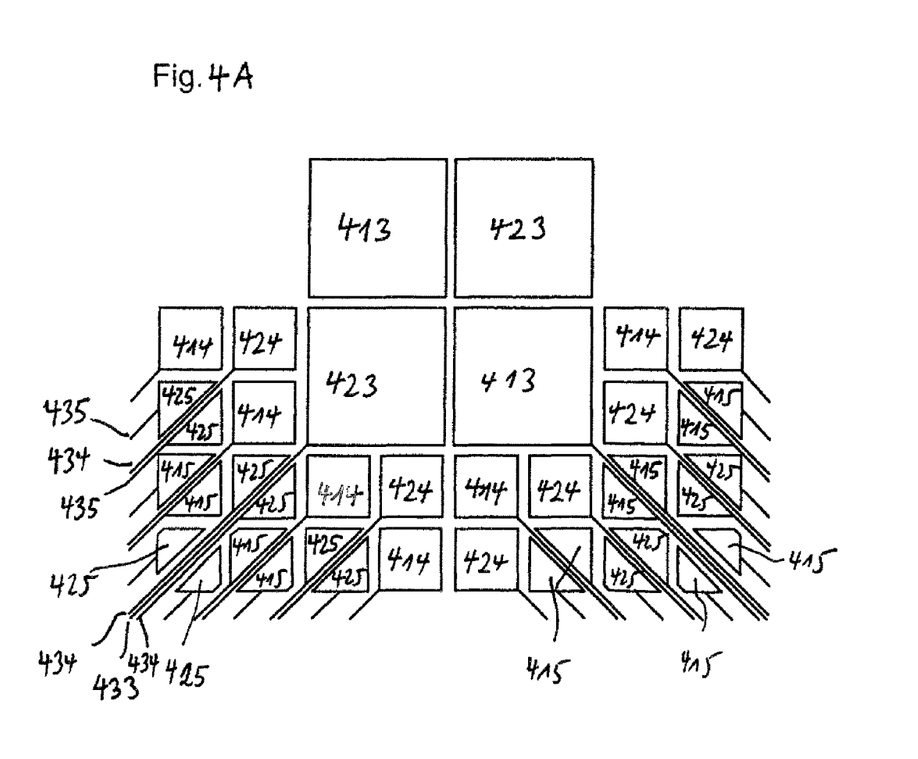
FIG. 4A illustrates a section from a multi-layer body according to the invention according to a second embodiment of the invention in top view.

In the arrangement according to FIG. 4A, different areas of surface 413, 423 of a first size and 414, 424 of a second size, as well as 415, 425 of a third size, are involved. Here also, the square areas of surface 413, 423 are in each case of a side length of between 0.5 and 3.2 cm, the square areas of surface 414 and 424 are of a side length of between 0.2 and 1.5 cm, and the triangular areas of surface 415, 425 substantially result from halving the areas of surface 414, 424. In the present case, in each case two adjacent areas of surface 413, 423 or 414, 424 or 415, 425, but optionally also spanning the sizes, for instance 413, 424, supplement each other to form a touch panel. The touch panels therefore overlap each other and are not drawn in detail in FIG. 4a.

Figure 4B:
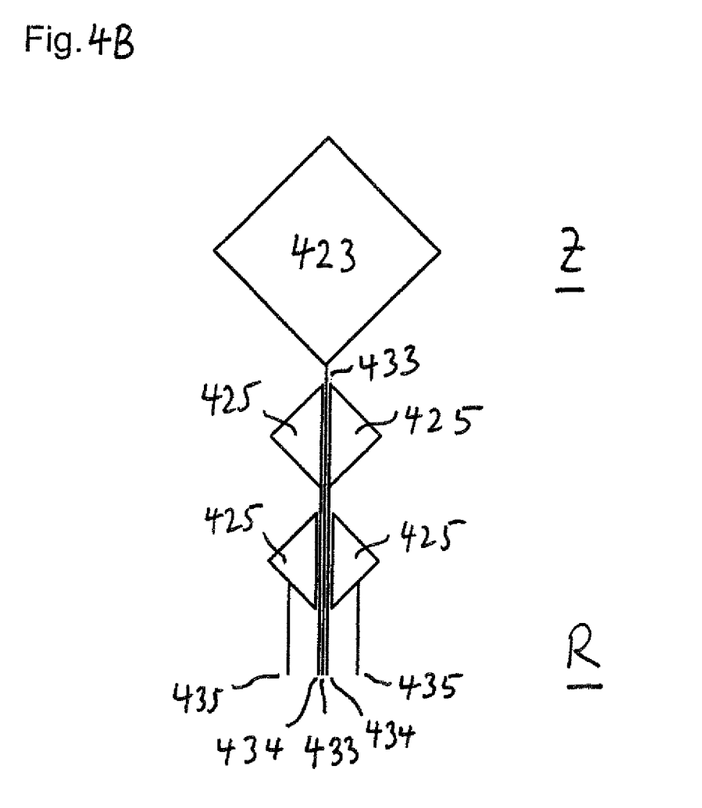
FIG. 4B illustrates a top view of a section of the embodiment according to FIG. 4A, in order to explain the concept according to the invention.

With reference to FIG. 4B, the advantage of the different sizes of the individual areas of surface 423, 425 becomes clear: As the area of surface 423 is larger than the areas of surface 425, there is only one connection line 433, there are two connection lines 434 and two connection lines 435, and there is sufficient space for all these connection lines 433, 434 and 435 at the edge R, whereas in the central area Z only space for one connection line 433 is needed. In the area of the edge R contact areas not shown in FIGS. 4A and 4B are formed, to which the connection lines 433, 434 and 435 lead.

Figure 5:
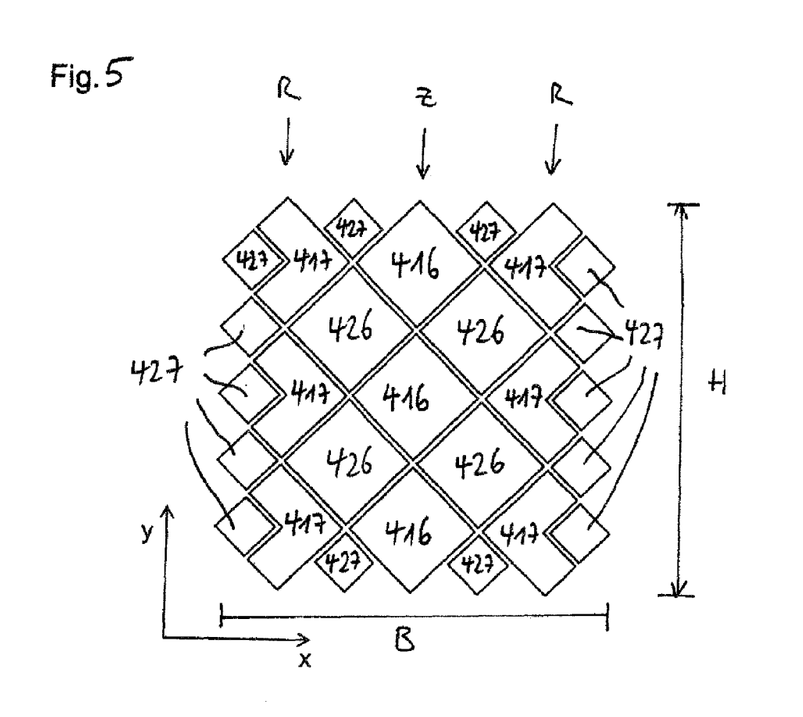
FIG. 5 illustrates a section from a multi-layer body according to the invention according to a third embodiment of the invention in top view.

In the arrangement according to FIG. 5, there is a stronger differentiation in the sizes of the individual areas of surface in the direction of the width B (x-direction), but less so in the direction of the height H (y-direction):

Areas of surface 416 of the first class of a first size alternate with identically sized areas of surface 426 of the second class; they are square, for example with a side length of between 0.5 and 3.2 cm. The areas of surface of the first class are present in two different sizes and shapes, namely as areas of surface 415 and 417, wherein the areas of surface 416, as mentioned, are square, the areas of surface 417 are L-shaped. The areas of surface of the second class are present in two different sizes as square areas of surface 426 and 427, wherein the respectively smaller areas of surface 427 adjoin the corners of the respectively larger areas of surface 426 of the same class in y-direction, but in x-direction lie exactly in the recesses of the L-shaped areas of surface 417, with the result that a touch panel in the form of a square results; other areas of surface 427 lie in the extension of the limb of the L-shaped areas 417. The side length of the square areas of surface 427 is between 0.2 and 1.5 cm. By the arrangement, it is ensured that in the edge area R is at least in x-direction connection lines not shown in FIG. 5 need not be arranged too closely packed, since only a few connection lines have to be fed from the central area through the edge area R. In the area of the edge R contact areas not shown in FIG. 5 are formed, to which connection lines lead.

Figure 6:
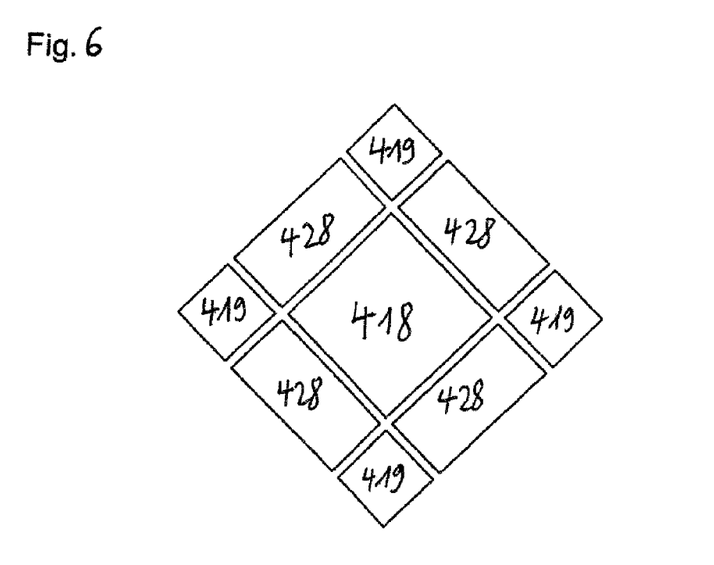
FIG. 6 illustrates a section from a multi-layer body according to the invention according to a fourth embodiment of the invention in top view.

In the arrangement according to FIG. 6 there is a central area of surface 418 of the first class in the shape of a square of for example a side length of between 0.5 and 3.2 cm, to the side of which rectangular areas of surface 428 of the second class adjoin which with their longer side likewise have a length of between 0.5 and 3 cm, matching the side length of the rectangular area of surface 418, and with the shorter side have a length of between 0.2 and 1.5 cm. Further areas of surface 419 of the first class with a side length of between 0.2 and 1.5 cm are located in the corners of the arrangement.

In such an arrangement, it is ensured that it is not necessary to lead too many connection lines outwardly to contact areas not shown in FIG. 6 because of an occupation of the central area that is too great.

Figure 7:
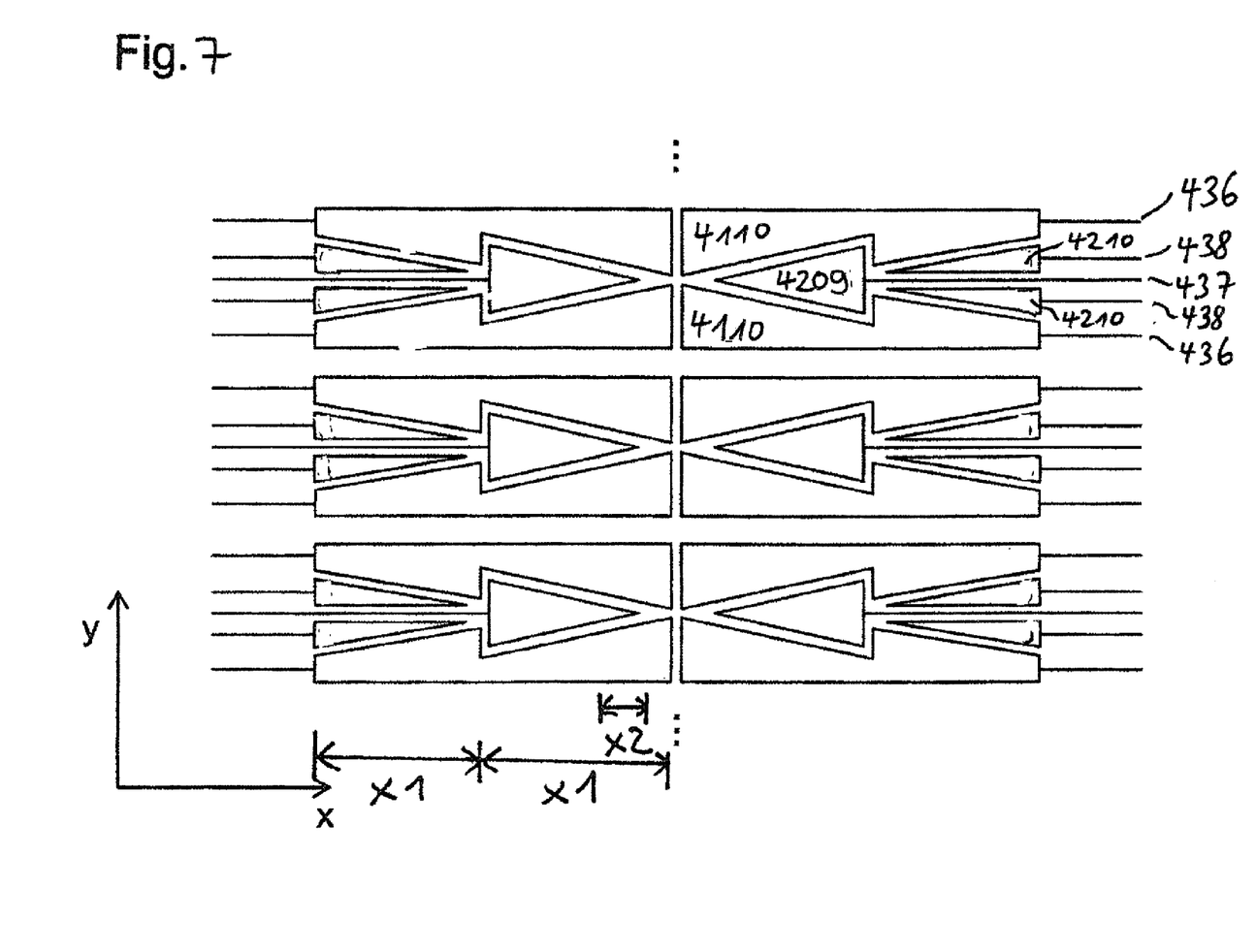
FIG. 7 illustrates a section from a multi-layer body according to the invention according to a fifth embodiment of the invention in top view.

In an arrangement according to FIG. 7 there are triangular areas of surface 4209 of the second class and 4210 of the second class of different size to that of the areas of surface 4209, which are surrounded by areas of surface 4110 of the first class which have a sawtooth outline, the edge incline of which is identical to the incline of the edges of the triangular areas of surface 4209 and 4210. From a central area of surface 4209 of the second class there is a connection line 437 outwardly towards contact areas (not shown), from the areas of surface 4110 of the first class in each case there is a connection line 436 outwardly. Connection lines 438 emanate outwardly from the areas of surface 4210. Overall only five connection lines are needed at the edge per group of five areas of surface. In this way, a resolution x2 can be achieved, which is smaller than the length of a unit x1 of the second areas of surface 4209, 4210. Such a resolution x2 is achieved on a same overall surface area usually with 8 to 12 rectangular areas of surface. By the specific design of the areas of surface 4209, 4210, 4110 from FIG. 7, a good resolution x2 is ensured with only a smaller number of areas of surface.

In all the embodiments named until now, the areas of surface in the centre Z are larger than at the edge R at least in one direction. Thus, a poorer resolution is knowingly accepted here in the centre Z. The inventors of the idea claimed in the present case have recognized that in the case of doubt a higher resolution is needed more at the edge R than in the central area Z. The areas of surface can therefore be designed larger in the central area Z, i.e. occupy a larger surface area, then at the edge R. A one-dimensional arrangement according to the type of FIG. 5 is provided at the edges R for example when scroll bars are arranged or menu bars are arranged, from which individual menu items have to be chosen by tapping. In the central panel Z it suffices if icons covering large areas can be selected by tapping. In two-dimensional arrangements in which the areas of surface are smaller towards two edge sides (for instance in the case of the rectangular area of surface 11 firstly upwards and downwards and secondly to the left and right), in the area of the total edge structures covering small areas can be selected, for instance menu bars at the top and bottom and scroll bars on the left and right. In the case of such two-dimensional arrangements it also suffices if only a smaller resolution is ensured in the central area Z.

In particular, it can be provided in the central area Z that a multi-touch operation is imperative in which an operator touches several areas of surface with two fingers simultaneously; then no resolution below the spacing of the fingers is necessary.

Figure 8:
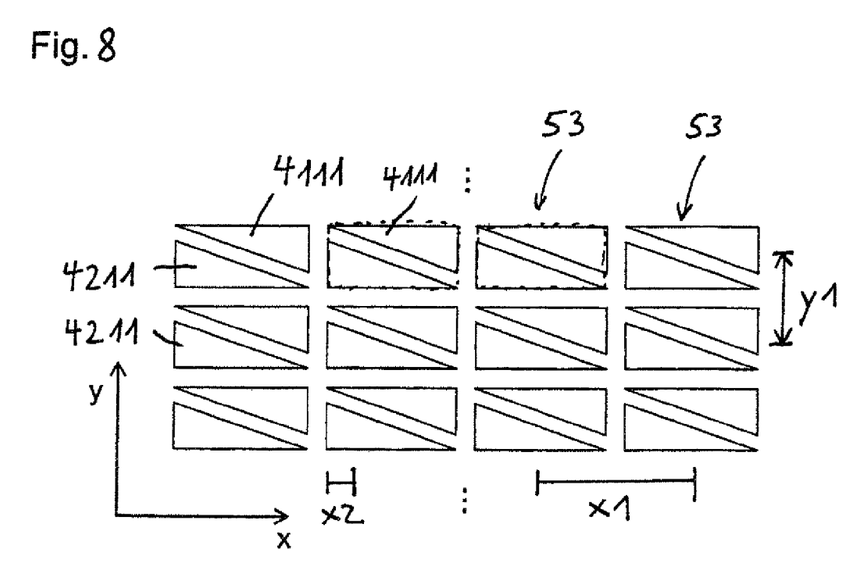
FIG. 8 illustrates a section from a multi-layer body according to the invention according to a sixth embodiment of the invention, by which a second and/or third aspect of same is implemented, in top view.

The advantage named for the arrangement according to FIG. 7, that a resolution x2 is achieved which is smaller than the length of a unit x1 of the areas of surface is similarly achievable in an arrangement according to FIG. 8:

In the arrangement according to FIG. 8 areas of surface 4111 of the first class and areas of surface 4211 of the second class have the same shape, namely in the present case triangular with a right angle in the triangle, and wherein in each case two areas of surface 4111, 4211 of different classes are rotated by 180° relative to each other, wherein the right angles point outwards, with the result that overall the shape of a rectangle different in the present case from a square (see dotted outline) results for a touch panel 53. In the arrangement according to FIG. 8 lines and columns can differ from each other, e.g. in the present case three lines and four columns are shown. By the areas of surface 4111 of the first class supplementing the areas of surface 4211 of the second class to form a shape that can be rasterized well (in the present case: rectangular shape) a relatively good resolution can be achieved relative to the absolute size of the individual areas of surface 4111, 4211, which has the result that the individual areas of surface 4111, 4211 can in each case have a relatively large surface area. For example, the shorter side length of the triangle can be between 0.2 and 1.5 cm long and the longer side of the triangle can be between 0.5 and 3.2 cm long. Here, it is ensured with relatively little outlay, with regard to the number of areas of surface 4111, 4211 overall and thus also connection lines towards the edge, that a multi-touch capacity can be achieved, that two fingers of an operator thus touch different touch panels 53, and that, using an assignment of the touch panels 53, this simultaneous touching is interpreted as the entry of a particular command. This multi-touch capacity is advantageously made possible in particular in x-direction by a rather coarser resolution with a grid spacing x1 between two touch panels 53, wherein in y-direction a smaller grid spacing y1 in this regular grid ensures that a sufficiently good resolution is achieved with the aid of one finger. In an arrangement of the triangle shapes as shown in FIG. 8, the larger grid spacing x1 is provided in the horizontal direction, which accounts for the fact that the multi-touch capacity is preferably to be used in the case of an outstretched hand by two fingers located next to each other and not by two fingers located one below the other. In the case of downward movement, one finger is typically drawn over the touch panel. The coarser resolution x1 is entirely sufficient for guaranteeing the multi-touch capacity, since the typical spacing of the touch of two fingers when a gesture is carried out is larger than x1. However, if only one finger is used for the touch, its position can be detected very accurately with the larger resolution x2, which is guaranteed by the special design of the touch panels 53.

In a modification of the embodiment according to FIG. 8, instead of triangles, other shapes could be provided if they supplement their own shape when it is rotated by 180° to form a suitable overall shape, in particular to form a rectangle.

If triangles are used, the gaps between the two areas of surface 4111, 4211, which are assigned to the same touch panel 53, are rectilinear. The angle of these straight lines is smaller with respect to one grid direction (x-direction) than with respect to the other grid direction (y-direction), the former angle, which corresponds to the acute angle of the triangle, is thus smaller than 45°. If other shapes are used instead of triangles, the gaps need not always be rectilinear, there can then be similar definitions in analogous application to the course of the gaps, e.g. the average incline of the gap can be defined, which is smaller than 1:1.

The embodiment according to FIG. 8 can be combined with the embodiments according to FIG. 1 to FIG. 7, to the extent that the arrangement shown in FIG. 8 can e.g. be provided exclusively in a central area Z (FIG. 1), but another shape can then be provided at the edge. In particular, the embodiments according to FIG. 8 and FIG. 7 can be combined well in this way (the combining of two touch panels 4111 to form a common touch panel substantially results in a touch panel like the touch panel 4110 from FIG. 7).

In all embodiments, touch panel devices that cover particularly large areas can be provided by the invention as multi-layer body 1, and the space is no longer insufficient for connection lines at the edge R.

In particular, a multi-touch functionality can also be produced very simply.

The invention claimed is:

1. Multi-layer body forming a capacitive touch panel device, comprising:
 at least one layer having a number of areas of surface;
 a plurality of electrically conductive elements on the at least one layer;
 said areas of surface are delimited in their shape and size by the respective electrically conductive elements;
 wherein the areas of surface comprise two classes, wherein certain of the areas of surface of the two classes are adjacent to one another, of which the electrically conductive elements of an area of surface of a first class form decoupling elements and the electrically conductive elements of an area of surface of a second class are galvanically separated from the electrically conductive elements of the first class forming coupling elements and are arranged such that each area of surface of the first class supplements at least one area of surface of the second class adjacent to it to form a touch panel;

wherein at least two areas of surface of the same class have a different size, wherein each area of surface of the first class is connected to a first electrical contact area at an edge of the at least one layer outside all of the areas of surface via an area of an electrical connection surface and each area of surface of the second class is connected to a second electrical contact area at the edge outside all the areas of surface via an area of an electrical connection surface; and wherein, of groups of areas of surface of different size, the smaller sizes are arranged closer to an edge at which a contact area is provided than the spacing of larger area sizes to said edge at which a contact area is provided.

2. Multi-layer body according to claim 1 wherein at least one subgroup of the areas of surface has two areas of surface of different size, and wherein every two areas of surface of different classes are assigned to each other to supplement each other to form a touch panel, and have the same size.

3. Multi-layer body according to claim 2 wherein areas of surface assigned to each other have the same shape.

4. Multi-layer body according to claim 3 wherein the areas of surface assigned to each other are rectangular, wherein rectangles of different size emanate from each other by scaling wherein the size of one rectangle relative to the other rectangle differs by a factor of less than 0.5.

5. Multi-layer body according to claim 1 wherein areas of surface assigned to each other are geometrically similar, and wherein their shapes are mirror-image symmetrical to each other.

6. Multi-layer body according to claim 5 wherein the areas of surface assigned to each other are triangular.

7. Multi-layer body according to claim 1 wherein an area of surface of the class other than the same class has a third size different from the two sizes of the two differently sized areas of surface.

8. Multi-layer body according to claim 7 wherein at least one area of surface of one class is assigned to more than one area of surface of the other class in order to supplement each other in each case to form a touch panel.

9. Multi-layer body according to claim 1 wherein areas of surface of different size are geometrically similar.

10. Multi-layer body according to claim 9 wherein of two adjacent areas of surface, one is square and one is rectangular with the side length of the square.

11. Multi-layer body according to claim 1 wherein areas of surface of different size are not geometrically similar.

12. Multi-layer body according to claim 11 including square areas of surface of one class and L-shaped areas of surface of the other class.

13. Multi-layer body according to claim 11 including triangular areas of surface of different size and/or different shape of one class and areas of surface of the other class with a sawtooth outline.

14. Multi-layer body according to claim 1 wherein the electrically conductive elements are provided in a single layer.

15. Multi-layer body according to claim 14, in which the electrically conductive elements comprise electrically conductive tracks in each case in a pattern by which the respective area of surface is delimited in its shape and size.

16. Multi-layer body according to claim 15 wherein the electrically conductive tracks are not transparent, but their width is chosen such that the areas of surface are transparent.

17. Multi-layer body according to claim 1 wherein the edges of the at least one layer are arranged with the contact areas only on two opposite sides of the entirety of the areas of surface, and in that the smaller areas of surface are arranged closer to an edge than the larger areas of surface only with respect to these edges.

18. Multi-layer body according to claim 1 wherein edges with contact areas completely surround the entirety of the areas of surface, and in that in all directions the small areas of surface are arranged closer to a respective edge than the larger areas of surface.

19. Multi-layer body according to claim 1 wherein at least two areas of surface of the first class and at least two areas of surface of the second class are in each case connected to each other via areas of a connection surface.

20. Multi-layer body according to claim 1 wherein the areas of connection surface are provided by electrically conductive tracks in each case in a pattern.

21. Multi-layer body forming a capacitive touch panel device comprising:

at least one layer having a number of areas of surface;

at least one electrically conductive element on the layer corresponding to each surface area for delimiting the respective area of surface in its shape and size;

wherein the areas of surface have two classes, wherein at least two areas of surface of the same class have a different size, wherein certain of the areas of surface of the two classes are adjacent to one another, of which the electrically conductive elements of an area of surface of a first class form decoupling elements and the electrically conductive elements of an area of surface of a second class are galvanically separated from the elements of the areas of surface of the first class and form coupling elements and are arranged such that each area of surface of the first class supplements in each case precisely one area of surface of the second class adjacent to it to form a touch panel;

wherein the mutually supplementing areas of surface have the same shape, different from a rectangle, but the shape of one is rotated by 180° compared with that of the other; and wherein the areas of surface can be assigned to lines and columns, and wherein in each line and each column in each case a number of areas of surface of the same class is provided.

22. Multi-layer body according to claim 21 wherein the areas of surface are triangular and have a right angle.

23. Multi-layer body according to claim 21 wherein two mutually supplementing areas of surface of a touch panel are separated from each other by a gap, and wherein all touch panels are arranged such that in a grid arrangement defined by the lines and columns two adjacent touch panels have a larger average grid spacing from each other in a first grid direction than in a second grid direction.

24. Multi-layer body according to claim 23 wherein each grid spacing of two adjacent touch panels in the first grid direction is larger than each grid spacing in the second grid direction.

* * * * *